United States Patent
Kuan et al.

(10) Patent No.: US 10,212,840 B2
(45) Date of Patent: Feb. 19, 2019

(54) CHASSIS STRUCTURE

(71) Applicants: Chang-Ming Kuan, Taipei (TW); Wei-Cheng Liu, Taipei (TW)

(72) Inventors: Chang-Ming Kuan, Taipei (TW); Wei-Cheng Liu, Taipei (TW)

(73) Assignee: COMPAL ELECTRONICS, INC., Taipei (TW)

(*) Notice: Subject to any disclaimer, the term of this patent is extended or adjusted under 35 U.S.C. 154(b) by 96 days.

(21) Appl. No.: 15/600,805

(22) Filed: May 22, 2017

(65) Prior Publication Data
US 2017/0347481 A1 Nov. 30, 2017

Related U.S. Application Data

(60) Provisional application No. 62/343,124, filed on May 30, 2016.

(51) Int. Cl.
*H05K 7/14* (2006.01)
*G06F 1/18* (2006.01)
(Continued)

(52) U.S. Cl.
CPC ........... *H05K 7/1489* (2013.01); *G06F 1/181* (2013.01); *G11B 33/128* (2013.01); *H05K 5/023* (2013.01);
(Continued)

(58) Field of Classification Search
CPC .... H05K 7/1489; H05K 5/023; H05K 7/1415; H05K 7/142; H05K 7/1487;
(Continued)

(56) References Cited

U.S. PATENT DOCUMENTS 2,495,109 A * 1/1950 Kramer ............ A47F 5/12
211/128.1
4,947,661 A * 8/1990 Yoshida ............ B60K 37/04
248/27.1

(Continued)

FOREIGN PATENT DOCUMENTS

| CN | 203941490 | 11/2014 |
|---|---|---|
| TW | M278998 | 10/2005 |
| TW | M522544 | 5/2016 |

*Primary Examiner* — Jonathan Liu
*Assistant Examiner* — Devin K Barnett
(74) *Attorney, Agent, or Firm* — JCIPRNET

(57) ABSTRACT

A chassis structure includes a chassis body and at least one holder module. The at least one holder module includes a frame, a handle, and a guiding assembly. The frame is detachably disposed in the chassis body and has a first linking portion. The handle has a holding portion, a second linking portion, and a third linking portion pivoted to the frame. The guiding assembly is disposed on the chassis body and has a first guiding channel, a second guiding slot, and a third guiding slot. The first guiding channel has a first segment, and the second guiding slot has a second segment and a third segment curvedly connected to each other. The first linking portion, the second linking portion, and the third linking portion are adapted to respectively move along the first segment, the third segment, and the third guiding slot simultaneously such that the frame moves upwards and rotates from a first position to a second position simultaneously.

9 Claims, 11 Drawing Sheets

(51) Int. Cl.
*H05K 5/02* (2006.01)
*G11B 33/12* (2006.01)

(52) U.S. Cl.
CPC ............ *H05K 7/142* (2013.01); *H05K 7/1415* (2013.01); *H05K 7/1487* (2013.01); *H05K 7/1409* (2013.01); *H05K 7/1457* (2013.01)

(58) Field of Classification Search
CPC .. H05K 7/1409; H05K 7/1457; F16M 11/041; G06F 1/181; G11B 33/128
USPC ........ 211/26; 312/223.2; 361/679.33–679.36, 361/724
See application file for complete search history.

(56) References Cited

U.S. PATENT DOCUMENTS

| | | | | |
|---|---|---|---|---|
| 5,332,306 A * | 7/1994 | Babb | ................... | H05K 7/1405 312/223.1 |
| 5,481,431 A * | 1/1996 | Siahpolo | ................ | G06F 1/184 361/679.31 |
| 5,641,296 A * | 6/1997 | Larabell | ................. | G06F 1/184 439/157 |
| 6,118,668 A * | 9/2000 | Scholder | ................ | G06F 1/184 361/679.32 |
| 6,137,684 A * | 10/2000 | Ayd | ..................... | H05K 7/1411 361/608 |
| 6,193,341 B1 * | 2/2001 | Eizadkhah | .............. | H05K 7/16 312/223.1 |
| 6,215,664 B1 * | 4/2001 | Hernandez | ............ | G06F 1/181 361/725 |
| 6,318,823 B1 * | 11/2001 | Liao | ....................... | G06F 1/184 312/223.2 |
| 6,386,120 B1 * | 5/2002 | Nelson | ................. | H05K 7/1489 108/134 |
| 6,507,487 B1 * | 1/2003 | Barina | .................... | G06F 1/184 312/236 |
| 6,529,373 B1 * | 3/2003 | Liao | ....................... | G06F 1/184 211/26 |
| 6,625,014 B1 * | 9/2003 | Tucker | ................... | G06F 1/184 312/223.1 |
| 6,882,527 B2 * | 4/2005 | Wang | .................... | G06F 1/184 312/223.2 |
| 6,956,737 B2 * | 10/2005 | Chen | ....................... | G06F 1/184 312/223.1 |
| 7,012,803 B1 * | 3/2006 | Austin | .................... | G06F 1/184 361/679.33 |
| 7,042,721 B2 * | 5/2006 | Olesiewicz | ............ | G06F 1/184 312/223.2 |
| 7,079,382 B2 * | 7/2006 | Chen | ....................... | G06F 1/184 248/298.1 |
| 7,090,528 B2 * | 8/2006 | Tuttle | .................... | G11B 33/122 361/679.33 |
| 7,092,249 B2 * | 8/2006 | Wang | .................... | G06F 1/181 248/73 |
| 7,097,476 B2 * | 8/2006 | Morikawa | ........ | H01R 13/62911 439/157 |
| 7,394,660 B2 * | 7/2008 | Hidaka | ................ | G11B 33/126 361/724 |
| 7,408,767 B2 * | 8/2008 | Han | ........................ | G06F 1/187 312/223.2 |
| 7,440,272 B2 * | 10/2008 | Chen | ..................... | G11B 33/121 174/60 |
| 7,643,280 B2 * | 1/2010 | Chen | ..................... | G11B 33/123 361/679.33 |
| 7,724,543 B2 * | 5/2010 | Ozawa | ................... | H04Q 1/02 361/729 |
| 8,203,835 B2 * | 6/2012 | Yeh | ......................... | G06F 1/187 248/220.21 |
| 8,339,778 B2 * | 12/2012 | Hughes | ................ | G11B 33/128 361/679.33 |
| 8,526,191 B2 * | 9/2013 | Peng | ..................... | G11B 33/124 206/701 |
| 8,550,576 B2 * | 10/2013 | Chen | ..................... | H05K 7/1487 312/223.2 |
| 8,582,287 B2 * | 11/2013 | Nguyen | ............... | G11B 33/124 211/126.6 |
| 8,789,901 B2 * | 7/2014 | Kuan | ................... | H05K 5/0221 109/47 |
| 8,807,488 B2 * | 8/2014 | Lee | ........................ | G06F 1/187 248/222.51 |
| 8,955,926 B2 * | 2/2015 | Gong | ..................... | G06F 1/187 312/223.2 |
| 9,122,458 B2 * | 9/2015 | Yu | .......................... | G06F 1/185 |
| 9,230,606 B2 * | 1/2016 | Ding | ..................... | G11B 33/02 |
| 9,282,658 B1 * | 3/2016 | Tsai | ...................... | G11B 33/124 |
| 9,462,719 B2 * | 10/2016 | Wu | ....................... | H05K 7/1409 |
| 9,648,949 B1 * | 5/2017 | Penaflor | ................ | A47B 81/00 |
| 9,674,978 B2 * | 6/2017 | Wu | ......................... | G06F 1/185 |
| 9,699,931 B2 * | 7/2017 | Chen | ..................... | H05K 7/1489 |
| 9,717,158 B2 * | 7/2017 | Della Fiora | .......... | H05K 7/1487 |
| 9,826,658 B1 * | 11/2017 | Mao | ....................... | H05K 7/1487 |
| 9,921,615 B2 * | 3/2018 | Chen | ........................ | G06F 1/18 |
| 10,045,458 B2 * | 8/2018 | Yu | ........................ | H05K 7/1489 |
| 2003/0155471 A1 * | 8/2003 | Dean | ........................ | G06F 1/184 248/27.1 |
| 2003/0202321 A1 * | 10/2003 | Lin | ........................ | G06F 1/184 361/679.33 |
| 2005/0051672 A1 * | 3/2005 | Dean | ........................ | G06F 1/184 248/27.1 |
| 2005/0066346 A1 * | 3/2005 | Wang | ................... | H05K 7/1489 720/657 |
| 2005/0068720 A1 * | 3/2005 | Lambert | ................. | G06F 1/184 361/679.03 |
| 2005/0185373 A1 * | 8/2005 | Chen | ....................... | G06F 1/184 361/679.38 |
| 2006/0061956 A1 * | 3/2006 | Chen | ........................ | G06F 1/18 361/679.4 |
| 2006/0120033 A1 * | 6/2006 | Zhang | .................... | G06F 1/184 361/679.39 |
| 2006/0171109 A1 * | 8/2006 | Chang | .................... | G06F 1/184 361/679.33 |
| 2006/0290246 A1 * | 12/2006 | Chen | ....................... | G06F 1/187 312/223.2 |
| 2007/0014085 A1 * | 1/2007 | Meserth | ................ | G06F 1/184 361/679.35 |
| 2007/0153451 A1 * | 7/2007 | Chen | ....................... | G06F 1/184 361/679.02 |
| 2007/0205010 A1 * | 9/2007 | Chen | ....................... | G06F 1/187 174/50 |
| 2008/0137280 A1 * | 6/2008 | Chen | ....................... | G06F 1/188 361/679.39 |
| 2008/0151523 A1 * | 6/2008 | Chen | ....................... | G06F 1/187 361/807 |
| 2008/0158809 A1 * | 7/2008 | Chen | ....................... | G06F 1/181 361/679.37 |
| 2008/0218958 A1 * | 9/2008 | Chen | ....................... | G06F 1/181 361/727 |
| 2009/0273901 A1 * | 11/2009 | Jaramillo | ............. | H05K 7/1492 361/679.58 |
| 2011/0289521 A1 * | 11/2011 | Chen | ..................... | G11B 33/124 720/601 |
| 2012/0217856 A1 * | 8/2012 | Chen | ....................... | G06F 1/187 312/327 |
| 2012/0243167 A1 * | 9/2012 | Chen | ....................... | G06F 1/187 361/679.31 |
| 2013/0009529 A1 * | 1/2013 | Zhu | ......................... | G06F 1/187 312/223.2 |
| 2013/0163182 A1 * | 6/2013 | Guo | ......................... | G06F 1/187 361/679.33 |
| 2013/0318770 A1 * | 12/2013 | Bridges | ............... | H05K 7/1409 29/525.11 |
| 2014/0001933 A1 * | 1/2014 | Zhou | ........................ | G06F 1/18 312/223.1 |
| 2014/0204497 A1 * | 7/2014 | Martinez Sanchez | .... | H01T 4/06 361/119 |
| 2015/0070830 A1 * | 3/2015 | Iwasaki | ................ | H05K 7/1487 361/679.33 |

(56) References Cited

U.S. PATENT DOCUMENTS

| | | | | |
|---|---|---|---|---|
| 2015/0108883 A1* | 4/2015 | Chen | ........................ | H05K 7/16 |
| | | | | 312/223.2 |
| 2015/0201520 A1* | 7/2015 | Jau | .......................... | G06F 1/187 |
| | | | | 211/26 |
| 2015/0342080 A1* | 11/2015 | Chen | ................... | H05K 7/20736 |
| | | | | 361/679.31 |
| 2015/0366095 A1* | 12/2015 | Junkins | ................ | H05K 5/0256 |
| | | | | 361/679.31 |
| 2016/0073537 A1* | 3/2016 | Tseng | .................... | G06F 1/1658 |
| | | | | 361/809 |
| 2016/0073554 A1* | 3/2016 | Marcade | ................ | H05K 5/023 |
| | | | | 211/26 |
| 2016/0135322 A1* | 5/2016 | Chen | .................... | G11B 33/142 |
| | | | | 361/679.46 |
| 2016/0138755 A1* | 5/2016 | Braucht | ............... | F16M 13/022 |
| | | | | 361/724 |
| 2016/0212877 A1* | 7/2016 | Chung | ................. | H05K 7/1487 |
| 2016/0242307 A1* | 8/2016 | Qi | ......................... | H05K 7/1489 |
| 2016/0353598 A1* | 12/2016 | Chen | .................... | H05K 7/1487 |
| 2017/0086326 A1* | 3/2017 | Peng | ......................... | H05K 7/16 |
| 2018/0157295 A1* | 6/2018 | Zhu | .......................... | G06F 1/187 |
| 2018/0242478 A1* | 8/2018 | Cui | .................... | H05K 7/20772 |

* cited by examiner

CHASSIS STRUCTURE

CROSS-REFERENCE TO RELATED APPLICATION

This application claims the priority benefits of U.S. provisional application Ser. No. 62/343,124, filed on May 30, 2016. The entirety of the above-mentioned patent application is hereby incorporated by reference herein and made a part of this specification.

FIELD OF THE INVENTION

The invention relates to a chassis structure. More particularly, the invention relates to a chassis structure in which an electronic module is able to be moved upwards and rotated.

DESCRIPTION OF RELATED ART

A server is a core computer used to serve computers or portable electronic devices in the network system. The server provides network users with functions such as disks required and printing services. Moreover, clients may share various resources in the network environment through the server. A plurality of hard disk modules are required to be disposed in the server in order to store large amount of data. As the hard disk modules are arranged in sequence and adjacent to each other in the server, how to repair or replace the hard disks of the hard disk modules conveniently and save hard disk space is very important.

SUMMARY OF THE INVENTION

The invention provides a chassis structure in which an electronic module disposed inside can be maintained or replaced easily and more electronic modules can be accommodated.

A chassis structure provided by the embodiments of the invention includes a chassis body and at least one holder module. The at least one holder module includes a frame, a handle, and a guiding assembly. The frame is detachably disposed in the chassis body and has a first linking portion. Moreover, the frame is adapted to carry an electronic module. The handle has a holding portion, a second linking portion, and a third linking portion located between the holding portion and the second linking portion and pivoted to the frame. The guiding assembly is disposed on the chassis body and has a first guiding channel, a second guiding slot, and a third guiding slot. The first guiding channel has a first segment, and the second guiding slot has a second segment and a third segment curvedly connected to each other. The first linking portion, the second linking portion, and the third linking portion are respectively and slidably disposed in the first guiding channel, the second guiding slot, and the third guiding slot. The second linking portion is adapted to move along the second segment to a junction between the second segment and the third segment when the holding portion is rotated. Next, the first linking portion, the second linking portion, and the third linking portion are adapted to respectively move along the first segment, the third segment, and the third guiding slot simultaneously such that the frame moves upwards and rotates from a first position to a second position simultaneously.

In an embodiment of the invention, an extending direction of the first segment is parallel to an extending direction of the third segment and perpendicular to an extending direction of the third guiding slot.

In an embodiment of the invention, an extending direction of the second segment is curved.

In an embodiment of the invention, the chassis body has a bottom surface, an extending direction of the first segment and an extending direction of the third segment are parallel to the bottom surface, and an extending direction of the third guiding slot is perpendicular to the bottom surface.

In an embodiment of the invention, the first guiding channel further has a fourth segment curvedly connected to the first segment, and the second guiding slot has a fifth segment curvedly connected to the third segment.

In an embodiment of the invention, the first linking portion and the second linking portion are adapted to respectively move along the fourth segment and the fifth segment simultaneously such that the frame moves upwards from the second position to a third position to be detached from the chassis body.

In an embodiment of the invention, an extending direction of the fourth segment is parallel to an extending direction of the fifth segment and parallel to an extending direction of the third guiding slot.

In an embodiment of the invention, the chassis body has a bottom surface, and extending directions of the fourth segment, the fifth segment, and the third guiding slot are perpendicular to the bottom surface.

In an embodiment of the invention, the at least one holder module further includes a hook rotatably disposed on the frame, such that the frame is hooked to the handle when being located in the second position.

In an embodiment of the invention, the at least one holder module further includes an elastic member connected to the frame and the hook.

To sum up, in the chassis structure of the embodiments of the invention, the guiding assembly guides the frame and the handle to move upwards and rotate relative to the chassis body through the first guiding channel, the second guiding slot, and the third guiding slot thereof. As such, the end surface of the electronic module carried by the frame may be moved upwards and rotate without being blocked by the adjacent electronic module, and that the user may maintain the electronic module through the end surface. In the chassis structure of the embodiments of the invention, the frame moves forwards only to a small extent relative to the chassis body and thus occupies relatively less space in the chassis body; therefore, compared to the conventional chassis structure, more rows of the frames can be disposed and more electronic modules can thus be accommodated.

To make the above features and advantages of the invention more comprehensible, several embodiments accompanied with drawings are described in detail as follows.

DESCRIPTION OF THE EMBODIMENTS

Figure 1:
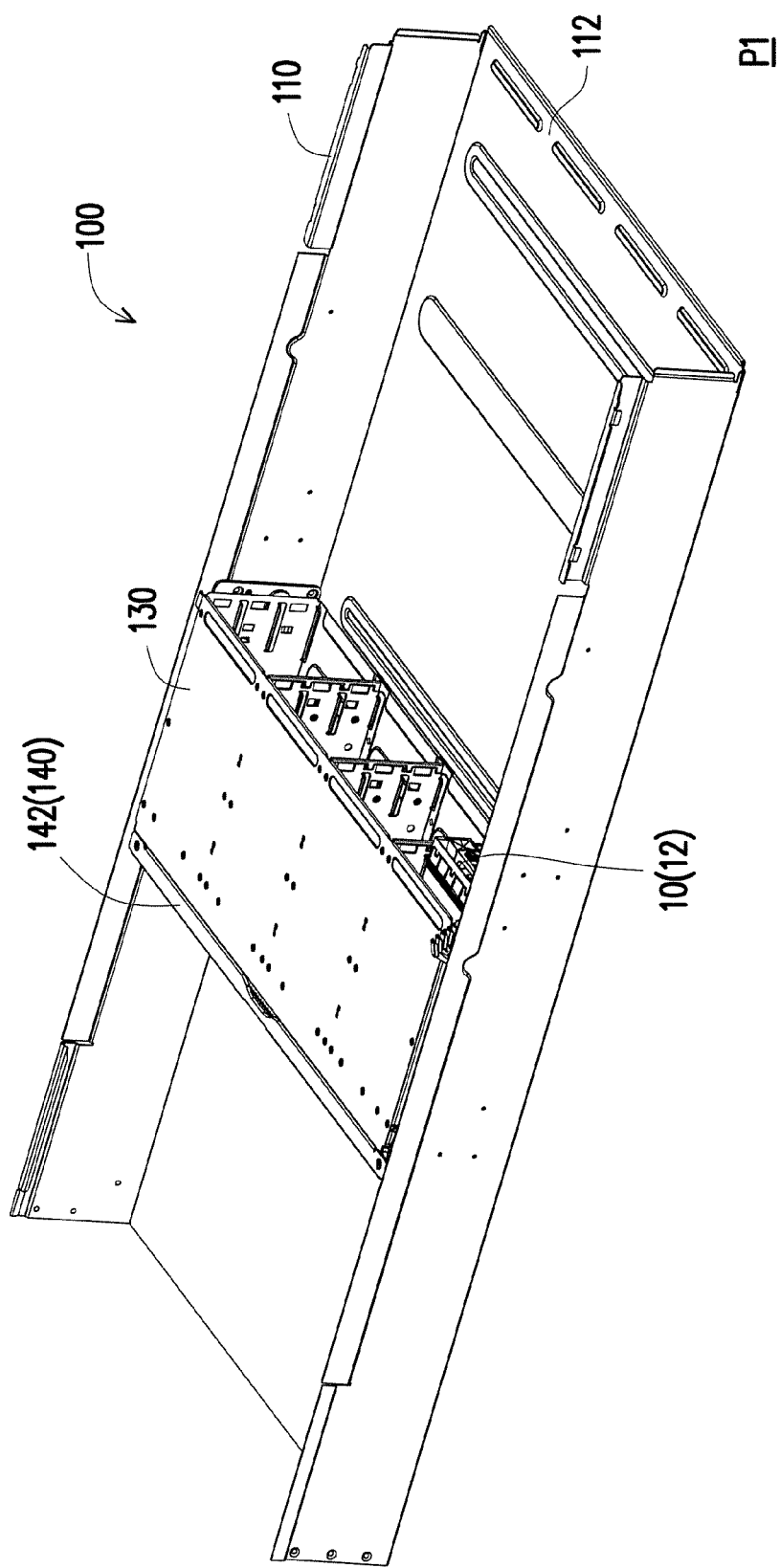
FIG. 1 is a schematic three-dimensional view of a frame of a chassis structure located in a first position according to an embodiment of the invention.
Figure 2:
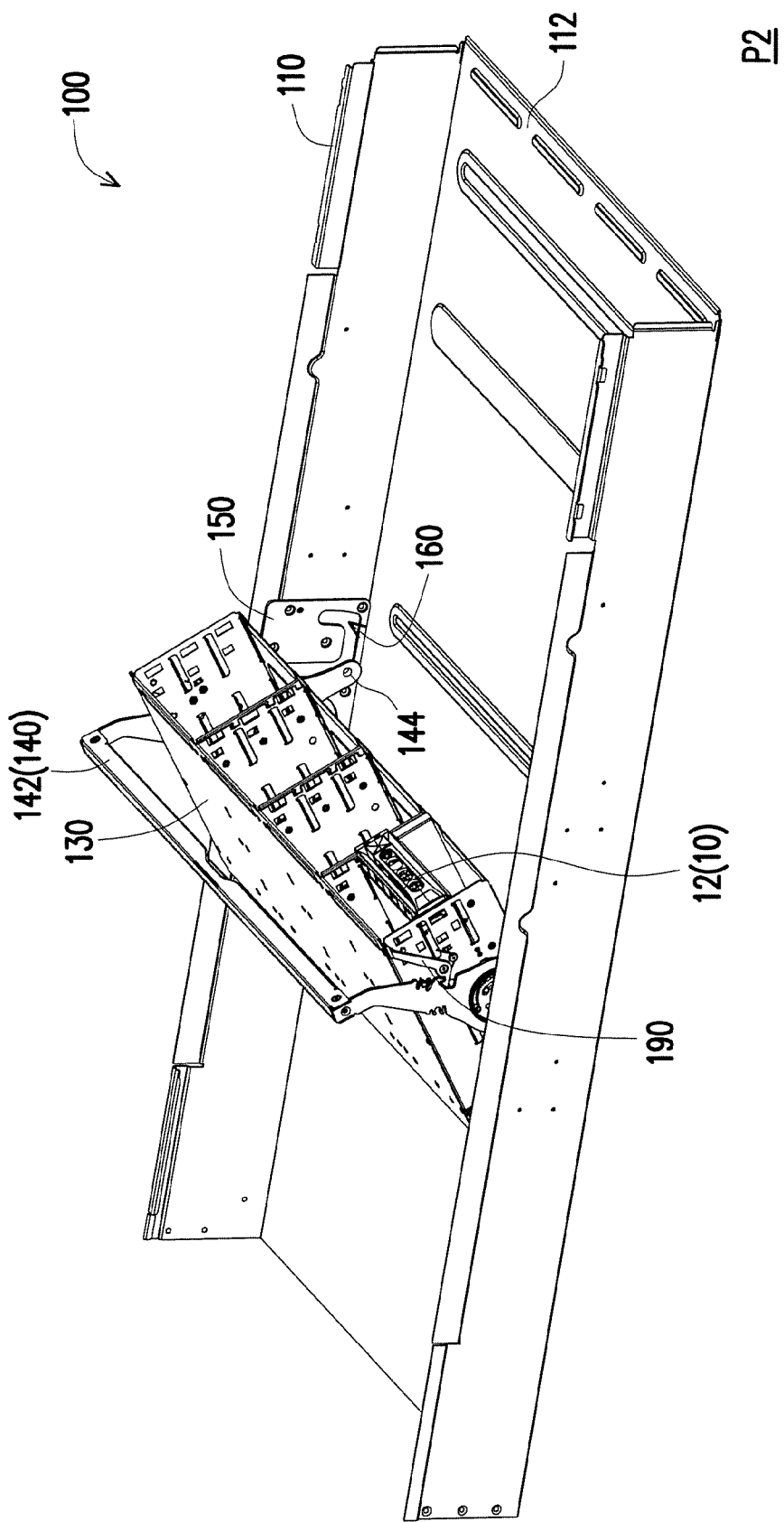
FIG. 2 is a schematic three-dimensional view of the frame of the chassis structure of FIG. 1 located in a second position.
Figure 3:
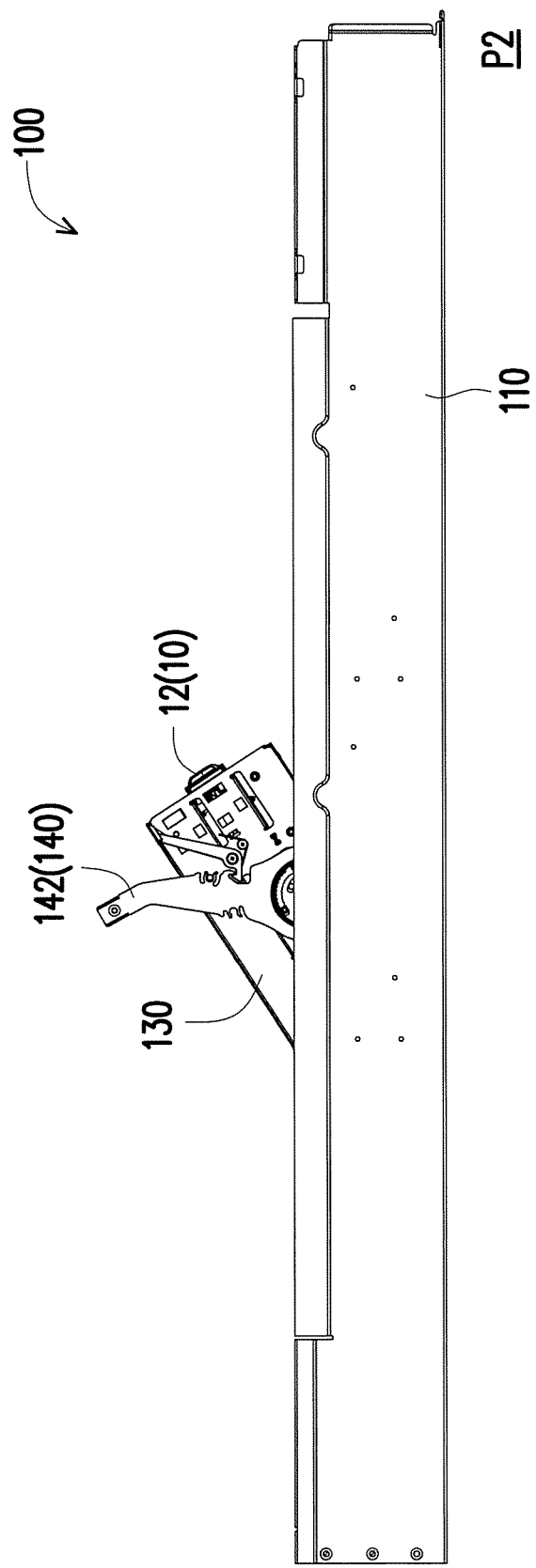
FIG. 3 is a schematic side view of FIG. 2.

FIG. 1 is a schematic three-dimensional view of a frame of a chassis structure located in a first position according to an embodiment of the invention. FIG. 2 is a schematic three-dimensional view of the frame of the chassis structure of FIG. 1 located in a second position. FIG. 3 is a schematic side view of FIG. 2. It is worth noting that in FIG. 1 to FIG. 3, only one frame 130 is schematically illustrated on a chassis body 110, and only one electronic module 10 is schematically illustrated in the frame 130. Nevertheless, practically, a plurality of the frames 130 which are able to be lifted up and turned over may be disposed on the chassis body 110, and a plurality of the electronic modules 10 may be included in the frames 130. The invention is not intended to limit numbers of the frame 130, a holder module 120, and the electronic module 10 of a chassis structure 100.

Referring to FIG. 1 to FIG. 3, in the present embodiment, the chassis structure 100 is exemplified as a chassis of a server, and the electronic module 10 accommodated in the chassis structure 100 is exemplified as a hard disk module of the server. Certainly, in other embodiments, the chassis structure 100 may be applied to other suitable types of devices, and the electronic module 10 may be other suitable types of components. The invention is not limited thereto.

Generally, the frame 130 configured to carry the electronic module 10 in the chassis structure 100 is located inside the chassis body 110 as shown in FIG. 1. When a hard disk in the electronic module 10 is required to be maintained or replaced, in the chassis structure 100, the frame 130 configured to carry the electronic module 10 is adapted to be lifted up and rotatably turned over relative to the chassis body 110 as shown in FIG. 2 and FIG. 3. As such, the hard disk in the electronic module 10 may be maintained by a user conveniently at an end surface 12 of the electronic module 10. Detailed description of the chassis structure 100 is as follows.

Figure 4:
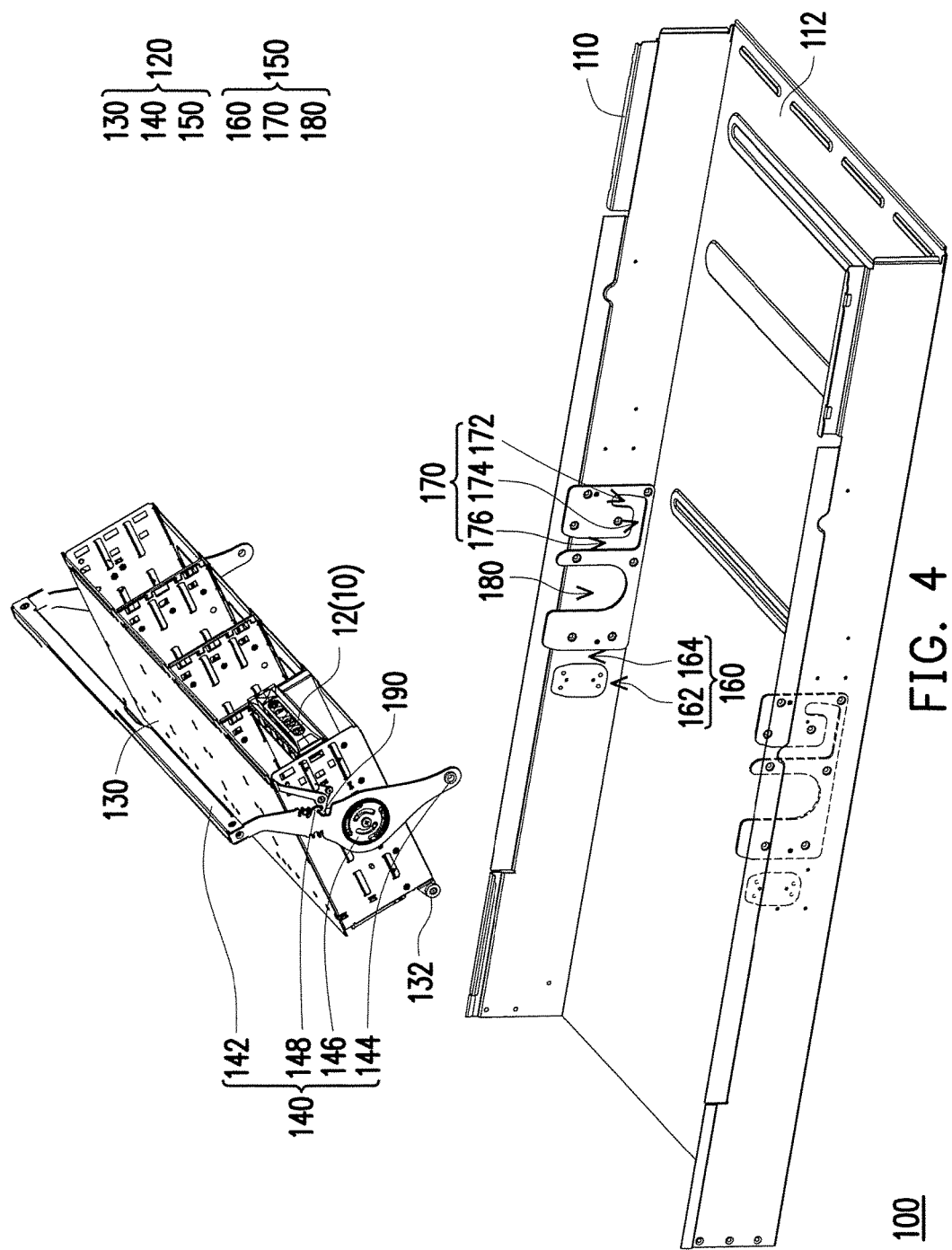
FIG. 4 is a schematic view of the frame is moved out of the chassis structure of FIG. 1.

FIG. 4 is a schematic view of the frame is moved out of the chassis structure of FIG. 1. Referring to FIG. 4, the chassis structure 100 of the present embodiment includes the chassis body 110 and the at least one holder module 120. The holder module 120 includes the frame 130, a handle 140, and a guiding assembly 150. The frame 130 is adapted to carry, for example, the electronic module 10 of the hard disk module, and is detachably disposed in the chassis body 110. The frame 130 has a first linking portion 132. The handle 140 has a holding portion 142, a second linking portion 144, and a third linking portion 146 located between the holding portion 142 and the second linking portion 144 and pivoted to the frame 130. In other words, the handle 140 may pivot relative to the frame 130.

The guiding assembly 150 is disposed on an inner side of the chassis body 110 and has a first guiding channel 160, a second guiding slot 170, and a third guiding slot 180. More specifically, the first guiding channel 160 has a first segment 162 and a fourth segment 164 curvedly connected to the first segment 162. The second guiding slot 170 has a second segment 172, a third segment 174 curvedly connected to the second segment 172, and a fifth segment 176 curvedly connected to the third segment 174. In the present embodiment, an extending direction of the first segment 162 is perpendicular to an extending direction of the fourth segment 164, such that the first guiding channel 160 is shown as a reversed L shape in the view angle of FIG. 4. An extending direction of the second segment 172 is curved, and an extending direction of the third segment 174 is perpendicular to an extending direction of the fifth segment 176, such that the second guiding slot 170 is shown as a reversed J shape in the view angle of FIG. 4. Certainly, the above shapes are viewed from a side of the chassis body 110 in the view angle of FIG. 4, and if the user stands at and views from the other side of the chassis body 110 in a view angle opposite to that of FIG. 4, the first guiding channel 160 is shown as a L shape, and the second guiding slot 170 is shown as a J shape. The third guiding slot 180 can provide a linear track.

In addition, the chassis body 110 has a bottom surface 112, and the extending directions of the first segment 162 and the third segment 174 are parallel to the bottom surface 112. The extending directions of the fourth segment 164, the fifth segment 176, and the third guiding slot 180 are perpendicular to the bottom surface 112, so as to define a moving direction relative to the bottom surface 112.

In the present embodiment, the first linking portion 132 of the frame 130 and the second linking portion 144 and the third linking portion 146 of the handle 140 are respectively disposed in the first guiding channel 160, the second guiding slot 170, and the third guiding slot 180 of the guiding assembly 150 on the chassis body 110 slidably. As such, the frame 130 can be lifted up and turned over relative to the chassis body 110 to expose the end surface 12 of the electronic module 10. One set of the holder module 120 is used for description in the following.

Figure 5:
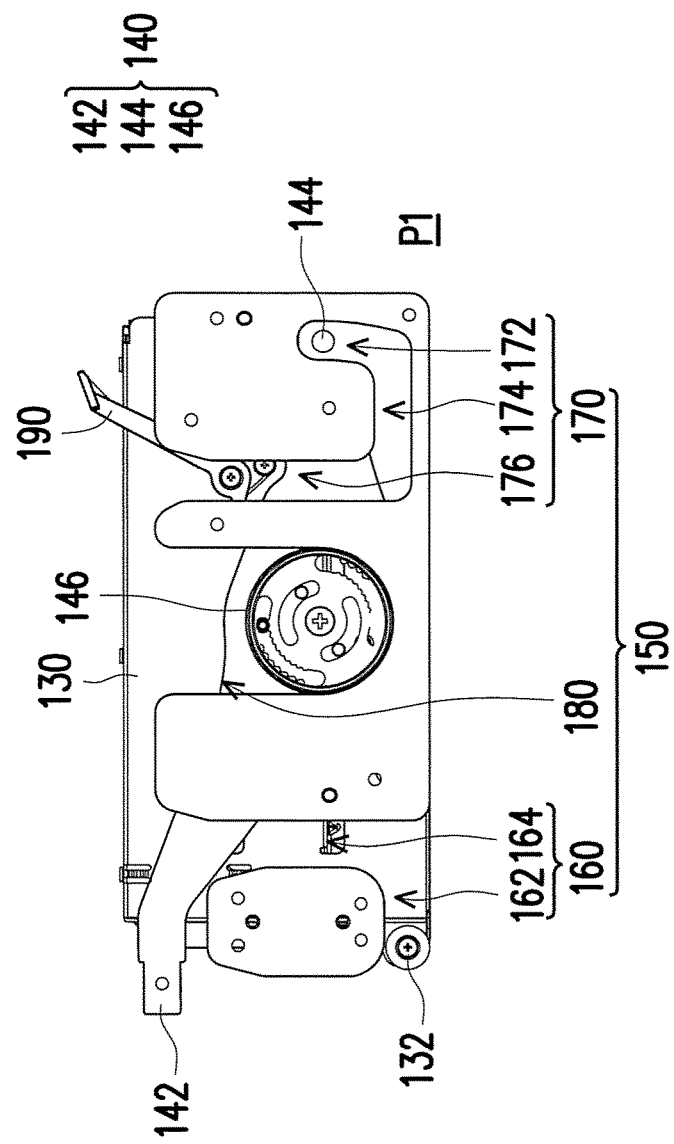
FIG. 5 is a schematic side view of the frame, the handle, and the guiding assembly when the frame of FIG. 1 is located in the first position.
Figure 6:
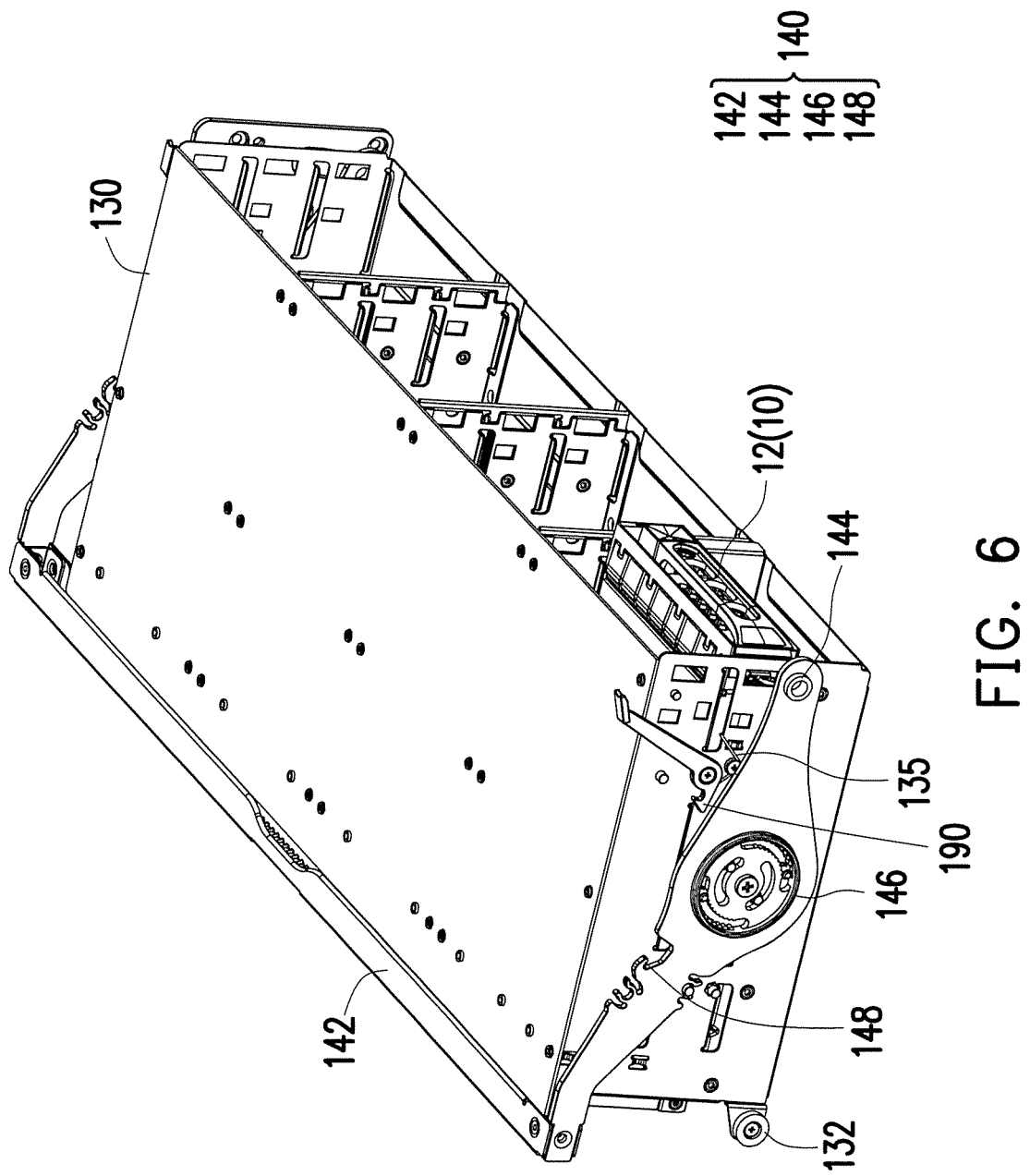
FIG. 6 is a schematic three-dimensional view of the frame and the handle of FIG. 5.

FIG. 5 is a schematic side view of the frame, the handle, and the guiding assembly when the frame of FIG. 1 is located in the first position. FIG. 6 is a schematic three-dimensional view of the frame and the handle of FIG. 5. In FIG. 5, when the frame 130 is located in a first position P1 relative to the chassis body 110, the first linking portion 132 of the frame 130 is located on a left end of the first segment 162 of the first guiding channel 160, the second linking portion 144 of the handle 140 is located on an upper end of the second segment 172 of the second guiding slot 170, and the third linking portion 146 of the handle 140 is located on a lower end in the third guiding slot 180. As can be seen in FIG. 5, the holding portion 142 of the handle 140 is not higher than the frame 130 at this time.

Figure 7:
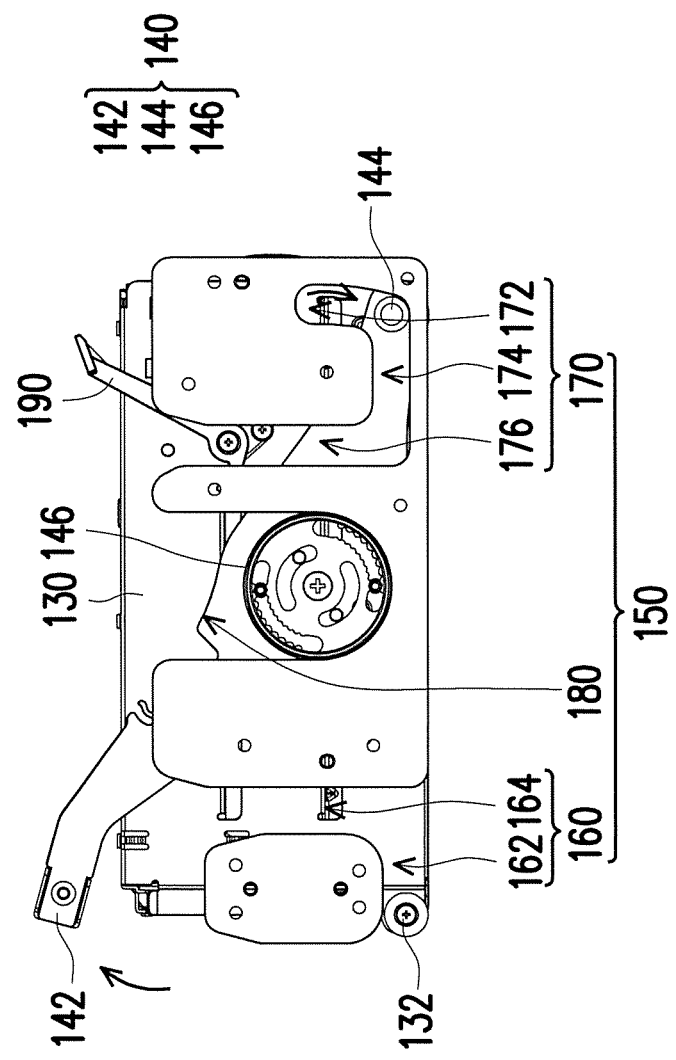
FIG. 7 is a schematic side view of a frame, a handle, and a guiding assembly after a handle is rotated.
Figure 8:
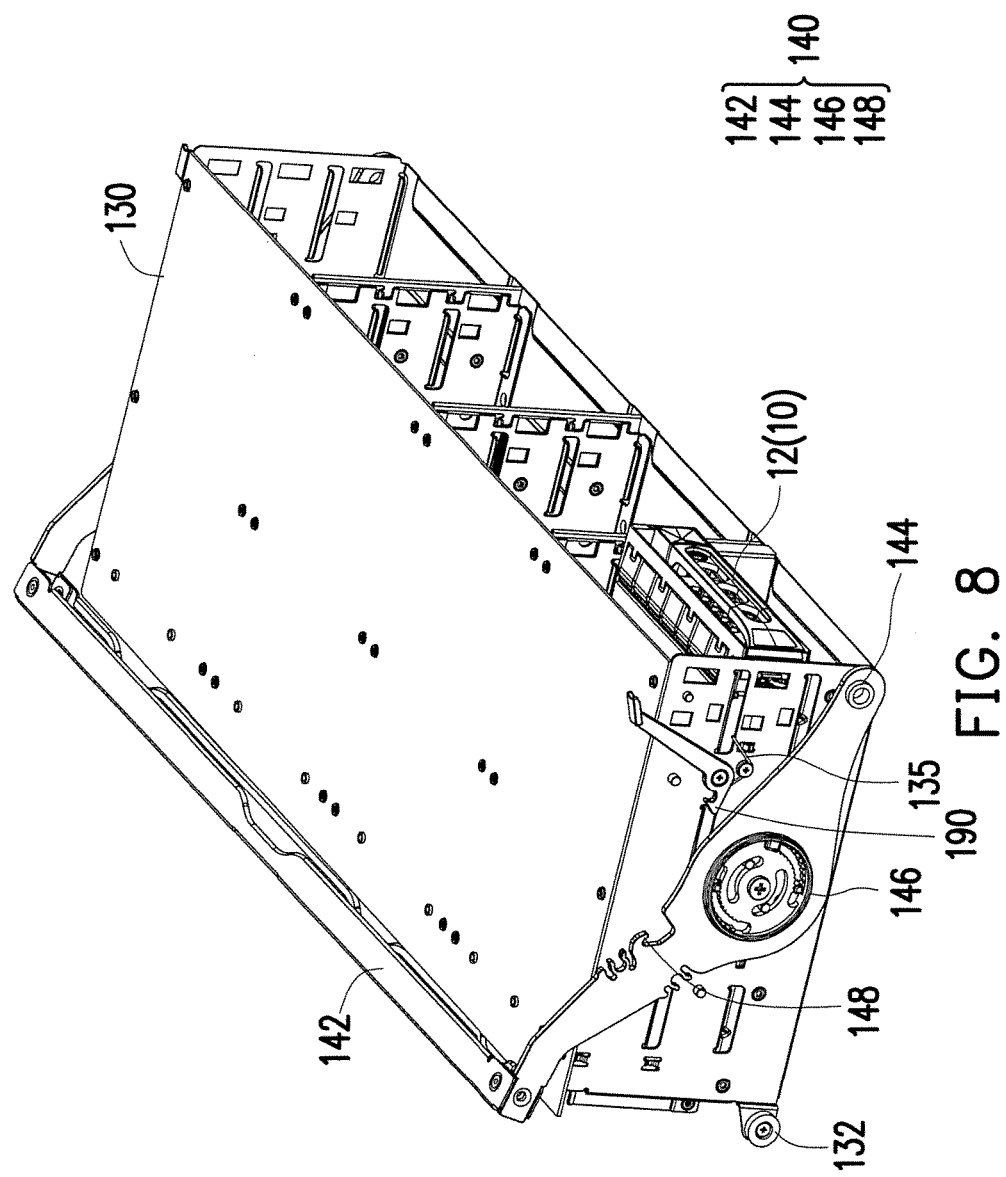
FIG. 8 is a schematic three-dimensional view of the frame and the handle of FIG. 7.

When intending to lift up and turn over the frame 130, the user may first rotate the holding portion 142 in a clockwise direction of FIG. 5. FIG. 7 is a schematic side view of a frame, a handle, and a guiding assembly after a handle is rotated. FIG. 8 is a schematic three-dimensional view of the frame and the handle of FIG. 7. Referring to FIG. 7 and FIG. 8, the holding portion 142 is moved to a position of FIG. 7 from a position of FIG. 5, such that the second linking portion 144 is moved downwards from the upper end of the second segment 172 along the second segment 172 to a lower end of the second segment 172, i.e., a junction between the second segment 172 and the third segment 174 or a right end of the third segment 174.

Figure 9:
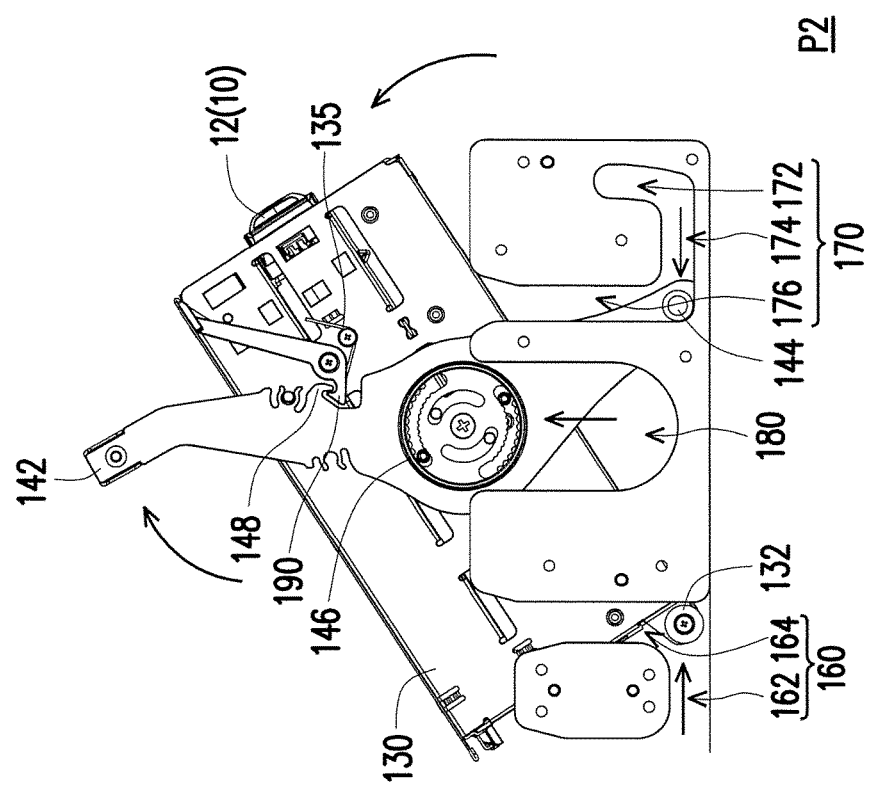
FIG. 9 is a schematic side view of a frame, a handle, and a guiding assembly when a frame is located in a second position.
Figure 10:
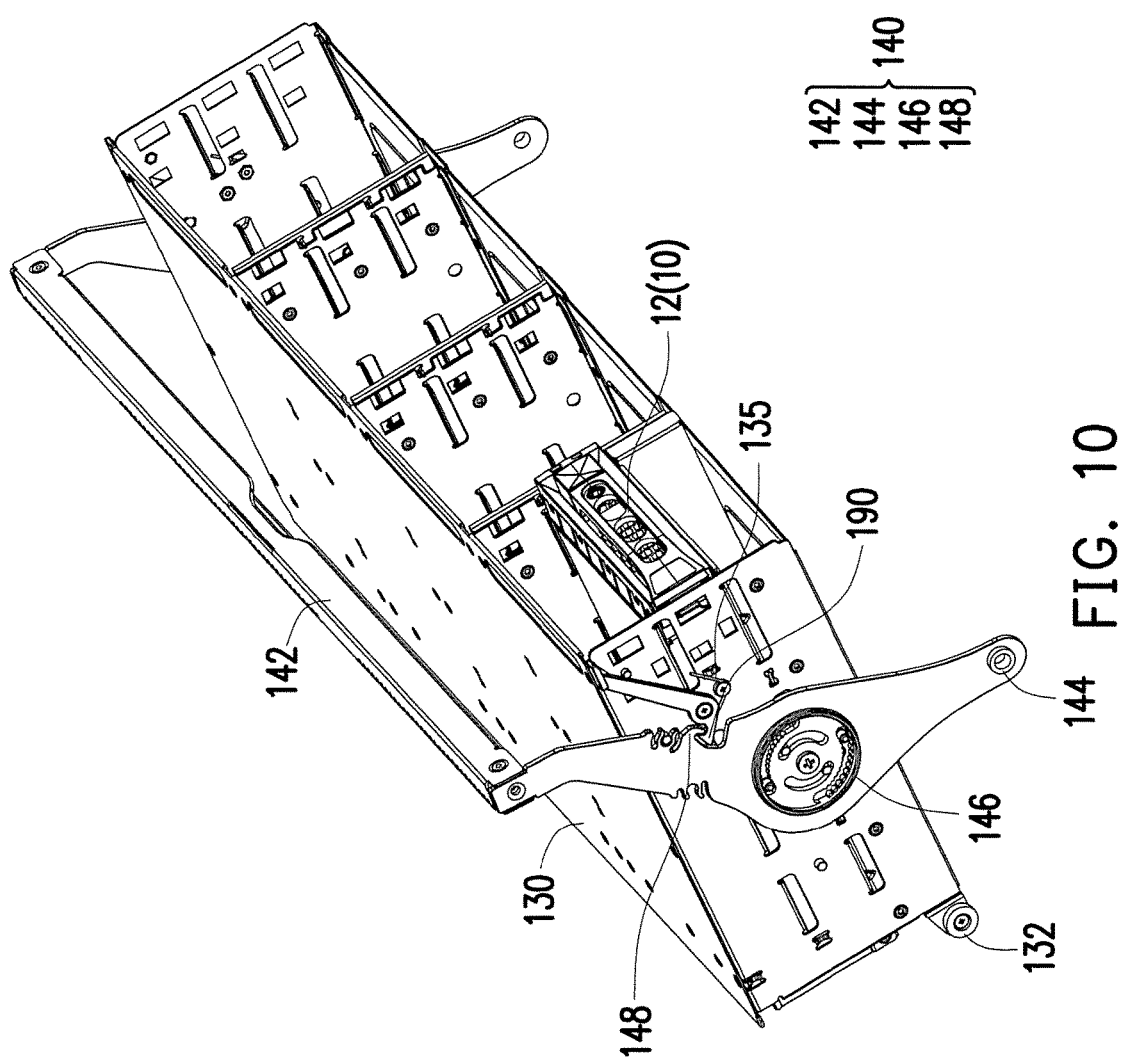
FIG. 10 is a schematic three-dimensional view of the frame and the handle of FIG. 9.

Next, the holding portion 142 is rotated in the clockwise direction continuously and is pulled up. FIG. 9 is a schematic side view of a frame, a handle, and a guiding assembly when a frame is located in a second position. FIG. 10 is a schematic three-dimensional view of the frame and the handle of FIG. 9. Referring to FIG. 9 and FIG. 10, in the process from FIG. 7 to FIG. 9, the first linking portion 132 of the frame 130 moves from the left end to a right end of the first segment 162 of the first guiding channel 160, the second linking portion 144 of the handle 140 moves from the right end to a left end of the third segment 174 of the second guiding slot 170, and the third linking portion 146 of the handle 140 moves from the lower end to an upper end in the third guiding slot 180. In other words, in the process from FIG. 7 to FIG. 9, the first linking portion 132, the second linking portion 144, and the third linking portion 146 moves simultaneously, such that the frame 130 simultaneously moves upwards from the first position P1 to a second position P2 to expose the end surface 12 of the electronic module 10, and that the user may replace or repair the electronic module 10 conveniently.

It is worth noting that when being filled with the electronic modules 10, the frame 130 as a whole may become considerably heavy, and it is quite laborious to lift up the frame 130 carrying the electronic modules 10 alone by the user. Thereby, in the process from FIG. 7 to FIG. 9, it can be seen that the first linking portion 132 of the frame 130 and the second linking portion 144 of the handle 140 can be viewed as two moving supporting points. The frame 130 is pressed on the bottom surface 112 of the chassis body 110 through the first linking portion 132 and the second linking portion 144, so as to support most of the weights of the frame 130 and the electronic module 10. Thereby, in the process from FIG. 7 to FIG. 9, the user only has to apply a force which enables the frame 130 and the electronic module 10 to move, rather than a force which can completely lift up the entire frame 130 and the electronic module 10. Such design allows the user to operate easily and effortlessly.

In addition, comparing FIG. 7 and FIG. 9, since the frame 130 simultaneously moves rightwards and turns over, a space occupied by the frame 130 in a left-right direction in the second position P2 is close to a space occupied in the left-right direction in the first position P1. In other words, in the present embodiment, no much space is required to be reserve in the chassis body 110 for the frame 130 to turn over in the left-right direction of FIG. 9. As such, in the present embodiment, much space is saved in the chassis body 110 for the holder module 120, and that the chassis body 110 can accommodate more rows of the holder modules 120 and carry more electronic modules 10.

In addition, in the present embodiment, the holder module 120 further includes a hook 190 and an elastic member 135, and the hook 190 is rotatably disposed on the frame 130. As shown in FIG. 9, when the frame 130 is located in the second position P2, the user can rotate the hook 190 such that the hook 190 is hooked to an engaging portion 148 of the handle 140, so as to fix a relative position between the handle 140 and the frame 130. Besides, the elastic member 135 is connected to the frame 130 and the hook 190, and in the present embodiment, the elastic member 135 is exemplified as a torsional spring, but the invention is not limited thereto. When the hook 190 is hooked to the engaging portion 148 of the handle 140, the elastic member 135 accumulates elastic potential energy. When the user unhooks the hook 190 from the engaging portion 148 of the handle 140, the elastic member 135 releases the elastic potential energy such that the hook 190 returns back to its original position.

In the embodiment, a rising height of the frame 130 operated from FIG. 7 to FIG. 9 is, for example, 15 mm, and a rotation angle of the frame 130 operated from FIG. 7 to FIG. 9 is, for example, 25 degrees. But the invention is not limited thereto.

Figure 11:
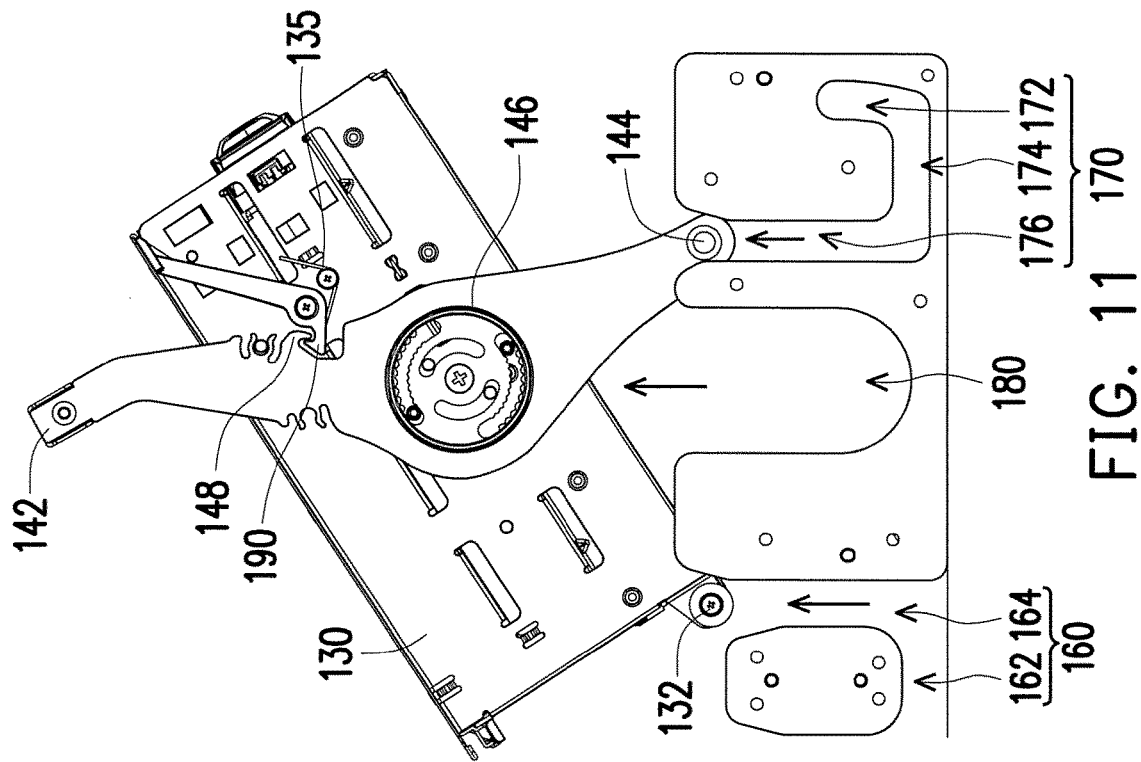
FIG. 11 is a schematic side view of a frame, a handle, and a guiding assembly when a frame is located in a third position.

FIG. 11 is a schematic side view of a frame, a handle, and a guiding assembly when a frame is located in a third position. Referring to FIG. 11, when intending to remove the frame 130 from the chassis body 110, the user only has to apply another upward force, and the first linking portion 132 and the second linking portion 144 can respectively move simultaneously along the fourth segment 164 of the first guiding channel 160 and the fifth segment 176 of the second guiding slot 170, and that the frame 130 moves upwards from the second position P2 to a third position P3 and thus be detached from the chassis body 110. Similarly, the foregoing step can be executed reversely if the frame 130 is intended to be installed to the chassis body 110, and it thus can be seen that the frame 130 can be detached or installed easily.

In view of the foregoing, in the chassis structure of the invention, the guiding assembly guides the frame and the handle to move upwards and rotate relative to the chassis body through the first guiding channel, the second guiding slot, and the third guiding slot thereof. As such, the end surface of the electronic module carried by the frame may be moved upwards and rotate without being blocked by the adjacent electronic module, and that the user may maintain the electronic module through the end surface. In addition, in the chassis structure of the invention, the frame moves forwards only to a small extent relative to the chassis body and thus occupies relatively less space in the chassis body; therefore, compared to the conventional chassis structure, more rows of the frames can be disposed and more electronic modules can thus be accommodated.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A chassis structure, comprising:
   a chassis body having a bottom surface and a pair of side walls extend upwardly from opposite ends the bottom surface; and
   at least one holder module, comprising:
   a frame detachably disposed in the chassis body between the side walls of the chassis body and having a first linking portion, wherein the frame defines at least one compartment therein, wherein the at least one compartment is adapted to carry an electronic module;
   a handle, having a holding portion defining a top end of the handle, a second linking portion protruding from a bottom portion of the handle, and a third linking portion located between the holding portion and the second linking portion and, wherein the third linking portion is rotatably fastened directly to the frame so that the handle rotates relative to the frame; and
   a guiding assembly, disposed on the chassis body and having a first guiding channel, a second L-shaped guiding slot, and a third guiding slot which are spaced apart from each other respectively, wherein the first guiding channel has a first segment, the second guiding slot has a second segment and a third segment curvedly connected to each other, and the first linking portion, the second linking portion, and the third linking portion are slidably disposed in the first guiding channel, the second guiding slot, and the third guiding slot respectively, wherein the second linking portion is adapted to move along the second segment to a junction between the second segment and the third segment when the holding portion is rotated, and then the first linking portion, the second linking portion, and the third linking portion are adapted to respectively move along the first segment, the third segment, and the third guiding slot simultaneously such that the frame moves upwards and rotates from a first position to a second position simultaneously.

2. The chassis structure as claimed in claim 1, wherein an extending direction of the first segment is parallel to an extending direction of the third segment and perpendicular to an extending direction of the third guiding slot.

3. The chassis structure as claimed in claim 1, wherein an extending direction of the first segment and an extending direction of the third segment are parallel to the bottom surface of the chassis body, and an extending direction of the third guiding slot is perpendicular to the bottom surface of the chassis body.

4. The chassis structure as claimed in claim 1, wherein the first guiding channel further has a fourth segment curvedly connected to the first segment, and the second guiding slot has a fifth segment curvedly connected to the third segment.

5. The chassis structure as claimed in claim 4, wherein the first linking portion and the second linking portion are adapted to respectively move along the fourth segment and the fifth segment simultaneously such that the frame moves upwards from the second position to a third position to be detached from the chassis body.

6. The chassis structure as claimed in claim 4, wherein an extending direction of the fourth segment is parallel to an extending direction of the fifth segment and parallel to an extending direction of the third guiding slot.

7. The chassis structure as claimed in claim 4, wherein extending directions of the fourth segment, the fifth segment, and the third guiding slot are perpendicular to the bottom surface of the chassis body.

8. The chassis structure as claimed in claim 1, wherein the at least one holder module further comprises a hook rotatably disposed on the frame such that the hook engages the handle when the frame is located in the second position.

9. The chassis structure as claimed in claim 8, wherein the at least one holder module further comprises an elastic member connected to the frame and the hook.

* * * * *